United States Patent [19]

Umemura et al.

[11] 4,144,512
[45] Mar. 13, 1979

[54] AFC VOLTAGE SUPERIMPOSING CIRCUIT FOR ELECTRONIC TUNER

[75] Inventors: Yoshiharu Umemura; Shigeo Matsuura, both of Yokohama, Japan

[73] Assignee: Hitachi, Ltd., Japan

[21] Appl. No.: 759,860

[22] Filed: Jan. 17, 1977

[30] Foreign Application Priority Data

Jan. 19, 1976 [JP] Japan ................... 51-4125

[51] Int. Cl.² .............................................. H03J 3/18
[52] U.S. Cl. ..................................... 334/15; 325/422;
331/36 C; 331/177 V
[58] Field of Search ......................... 331/36 C, 177 V;
334/15; 325/418, 420–423; 358/195

[56] References Cited
U.S. PATENT DOCUMENTS

| | | | |
|---|---|---|---|
| 3,699,455 | 10/1972 | Kruszewski et al. | 325/422 X |
| 3,824,474 | 7/1974 | Sakamoto | 334/15 X |
| 3,959,728 | 5/1976 | Yamazaki et al. | 331/36 C X |
| 3,991,371 | 11/1976 | Shelby | 325/422 |
| 4,005,256 | 1/1977 | Arumugham | 325/422 X |

*Primary Examiner*—Paul L. Gensler
*Attorney, Agent, or Firm*—Craig & Antonelli

[57] ABSTRACT

An AFC voltage superimposing circuit for an electronic tuner using a plurality of varactors as a tuning element, comprising a plurality of resistors for superimposing an AFC voltage on a tuning voltage and a bypass circuit. The bypass circuit includes at least a voltage regulating diode and a diode which are connected in series so as to have the characteristic of permitting a current to flow in one direction only. When the tuning voltage exceeds a predetermined level, the voltage regulating diode comes into a conducting state, thereby increasing the AFC voltage variation superimposed on the tuning voltages, so that the interchannel deviation of AFC sensitivity may be gently compensated.

3 Claims, 10 Drawing Figures

F I G. 3
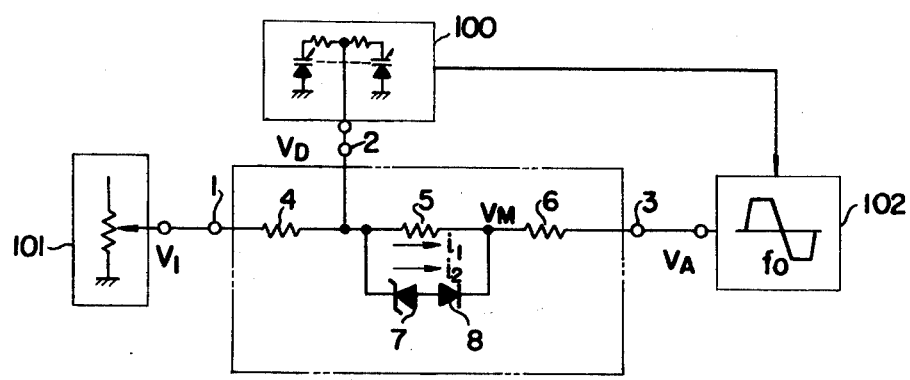
F I G. 4
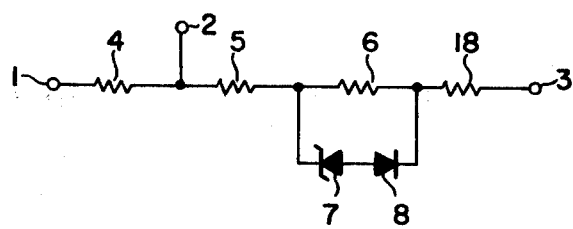
F I G. 5
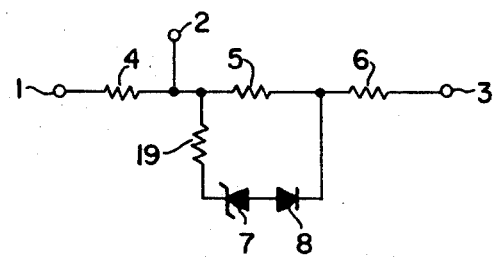

AFC VOLTAGE SUPERIMPOSING CIRCUIT FOR ELECTRONIC TUNER

BACKGROUND OF THE INVENTION

This invention relates to an AFC circuit arrangement for an electronic tuner using a plurality of varactors as a tuning element, or more in particular to an improved circuit for superimposing an AFC voltage on a tuning voltage thereby to control the oscillation frequency of a local oscillator circuit.

In a conventional electronic tuner, an AFC varactor is included in a local oscillator circuit and impressed with an AFC voltage for compensating the variations of the oscillation frequency. Since the varactor is operated at high frequencies, lead wires thereof must be as short as possible, thus making it difficult to design the location of component parts of the electronic tuner and also assemble those parts. In order to overcome the foregoing disadvantages, there was provided a method of controlling the oscillation frequency of the local oscillator circuit by means of superimposing an AFC voltage on a tuning voltage. However, in such conventional methods, the AFC voltage is superimposed on a power source voltage so that the superimposed voltage may be outputted from a slider terminal of a variable resistor together with the tuning voltage, or the AFC voltage is superimposed on the tuning voltage by means of a resistor matrix. Therefore, the foregoing conventional methods have such disadvantages that since AFC voltage dividing ratios vary with the preset position of the variable resistor, the interchannel deviation of AFC sensitivity is increased even when AFC sensitivity is properly preset, and that the variations in the tuning voltage characteristics of the tuner cause variations in the AFC sensitivity.

SUMMARY OF THE INVENTION

Accordingly, in order to overcome the foregoing disadvantages of the conventional electronic tuner, it is an object of the present invention to provide an improved AFC voltage superimposing circuit by which the gentle compensation of the interchannel deviation of AFC sensitivity can be attained in the wide voltage range of tuning voltages.

In order to attain the foregoing object, in accordance with the invention, there is provided an AFC voltage superimposing circuit which comprises a first terminal connected to a tuning voltage generating circuit, a second terminal connected to a tuning circuit, a third terminal connected to an AFC voltage generating circuit, a first resistor connected between the first and second terminals, a first series-circuit including at least a second and a third resistor connected in series, and a second series-circuit including a voltage regulating diode and a diode connected in series and having the characteristic of permitting a current to flow in one direction only, and in which the second seriescircuit is connected in parallel to one of the second and third resistors.

In further accordance with the invention, the second series-circuit may be constituted of a transistor with its base kept open, and its base-emitter and its base-collector junction may be adapted to operate as a voltage regulating diode and a diode, respectively.

BRIEF DESCRIPTION OF THE DRAWING

FIGS. 3 to 7 are circuit diagrams showing the embodiments of the AFC voltage superimposing circuit according to the invention.

DETAILED DESCRIPTION OF THE INVENTION

For better understanding of the invention, the description of the conventional AFC voltage superimposing circuit will be made below with reference to FIG. 1.

Figure 1:
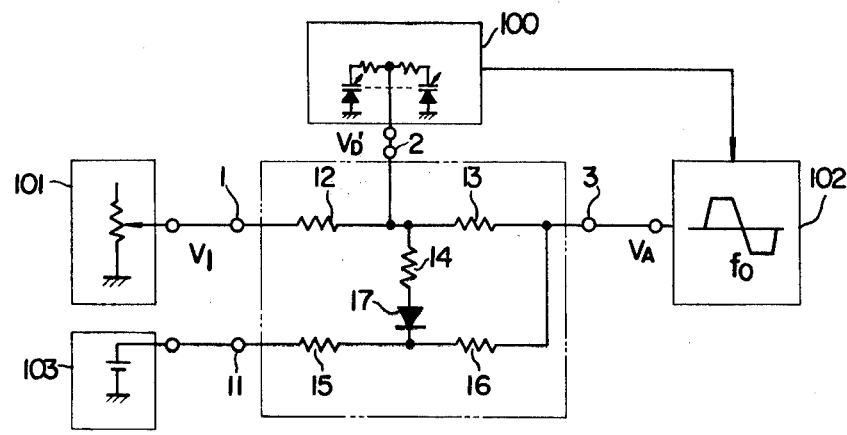
FIG. 1 is a circuit diagram for illustrating an example of the conventional AFC voltage superimposing circuit capable of compensating an interchannel deviation of AFC sensitivity.

Referring to FIG. 1, reference numeral 1 designates a tuning voltage input terminal connected to a tuning voltage generating circuit 101 and impressed with a tuning voltage, numeral 2 a tuning voltage output terminal connected to a tuning circuit 100 and outputting a tuning voltage to be applied thereto, numeral 3 an AFC voltage input terminal connectd to an AFC voltage generating circuit and impressed with an AFC voltage, and numeral 11 a power source terminal connected to a power source 103 and impressed with a power source voltage. Reference numerals 14 to 16 designate resistors for controlling the amplitude of the AFC voltage superimposed on the tuning voltage in accordance with the tuning voltage, and numeral 17 a diode for blocking a reverse current. Reference character $V_1$ designates a tuning voltage applied to the tuning voltage input terminal 1, reference character $V_D'$ a tuning voltage outputted from the tuning voltage output terminal 2, reference character $V_A$ an AFC voltage applied to the AFC voltage input terminal 3, reference character $\Delta V_A$ a small change of AFC voltage, reference character $\Delta V_D'$ an amount of AFC voltage superimposed on the tuning voltage outputted from the tuning voltage output terminal 2 in response to the small change of AFC voltage $\Delta V_A$ in the case where the tuning voltage $V_1$ exceeds a predetermined level and then the diode 17 comes into a conducting state.

However, as described in detail later, the conventional AFC voltage superimposing circuit has such a disadvantage that the tuning voltage range thereof becomes much narrower than that according to the present invention when the same AFC sensitivity is required. Next, an embodiment of the present invention will be described in detail below. One embodiment of the AFC voltage superimposing circuit of the electronic tuner according to the invention is shown in FIG. 3. Referring to FIG. 3, reference numeral 1 designates a tuning voltage input terminal connected to a tuning voltage generating circuit 101 and impressed with a tuning voltage, numeral 2 a tuning voltage output terminal connected to a tuning circuit 100 and outputting a tuning voltage, numeral 3 an AFC voltage input terminal connected to an AFC voltage generating circuit 102, numerals 4 to 6 resistors for superimposing the AFC voltage on the tuning voltage, numeral 7 a voltage regulating diode for controlling the amplitude of the AFC voltage superimposed on the tuning voltage in accordance with the tuning voltage, and numeral 8 a diode for blocking a reverse current.

Figure 2:
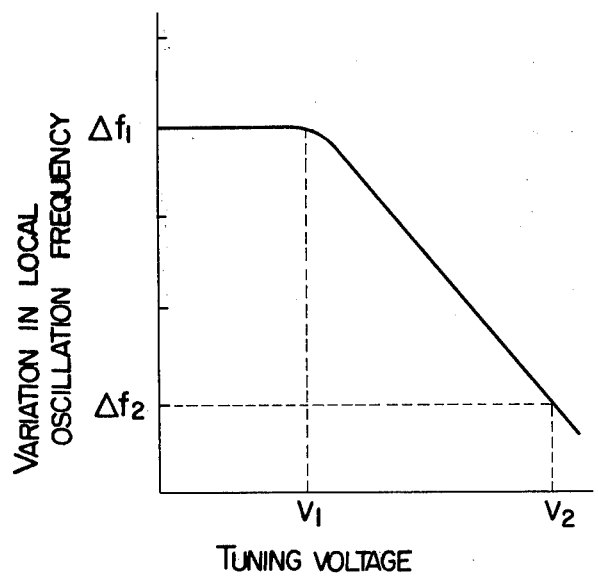
FIG. 2 is a diagram for illustrating an example of variations in a local oscillation frequency with a small change of tuning voltages.

An example of variations in the local oscillation frequency with a small change of tuning voltage is shown in FIG. 2. It will be seen that when the tuning voltage is lower than $V_1$, the variations in the local oscillation frequency is substantially constant at $\Delta f_1$, while in the case of the tuning voltage exceeding $V_1$, the variations in the local oscillation frequency is decreased and reaches $\Delta f_2$ at the maximum tuning voltage $V_2$. In the case where a fixed AFC voltage is superimposed on the tuning voltage regardless of its location in UHF band of the electronic tuner, the interchannel deviation of the AFC sensitivity becomes 3 to 5 times since $\Delta f_1$ is three to five times as much as $\Delta f_2$. In order to overcome this shortcoming, according to the invention, the AFC voltage superimposed on the tuning voltage is varied according to the tuning voltage, thereby reducing the interchannel deviation of the AFC sensitivity.

In FIG. 3, it is assumed that the zener voltage of the voltage regulating diode 7 is $V_Z$, the forward voltage-drop across the diode 8 is $V_F$, the voltage at the tuning voltage output terminal 2 is $V_D$, the voltage at the junction point between the resistor 5 and the resistor 6 is $V_M$, the resistance values of the resistors 4, 5 and 6 are $R_4$, $R_5$ and $R_6$ respectively, the AFC voltage superimposed on the tuning voltage is $\Delta V_D$, the reference voltage of the AFC voltage applied to the terminal 3 is $V_A$, and the amplitude change of the AFC voltage is $\Delta V_A$.

When the tuning voltage is so small as to satisfy the following relation:

$$V_D - V_M < V_Z + V_F \quad (1)$$

both the voltage regulating diode 7 and the diode 8 are in a nonconducting state and, therefore, the AFC voltage superimposed on the tuning voltage is determined by the ratio of the resistors 4, 5 and 6, thus leading to $$\Delta V_D = R_4 \cdot \Delta V_A / (R_4 + R_5 + R_6) \quad (2)$$

When the tuning voltage at the terminal 2 increases to such a degree that the voltage regulating diode conducts, the resistor $R_5$ is short-circuited with a low impedance and therefore the AFC voltage superimposed on the tuning voltage is given as $$\Delta V_D = R_4 \cdot \Delta V_A / (R_4 + R_6) \quad (3)$$

This increase in the AFC voltage compensates for the interchannel deviation in the AFC sensitivity due to the variations in local oscillation frequency with channels, as shown in FIG. 2.

In the foregoing description, the voltage regulating diode 7 is used to preset the potential at which the voltage regulating diode 7 and the diode 8 conduct on the one hand, and to gently compensate the interchannel deviation of the AFC sensitivity due to the variations in the tuning voltage on the other hand when the tuning voltage exceeds the preset potential and the voltage regulating diode 7 and the diode 8 conduct. These functions will be described below.

In FIG. 3, assume that the current flowing in the resistor 5 and the current flowing in the voltage regulating diode 7 are $i_1$ and $i_2$, respectively. At the tuning voltage $V_{D1}$ immediately before conduction of the voltage regulating diode 7, the following relationship is present:

$$i_1 = (V_Z + V_F)/R_5 \quad \left.\begin{array}{r}\\ \\\end{array}\right\} \quad (4)$$
$$i_2 = 0$$

The tuning voltage $V_{D1}$ under this conditions is obtained from the equations (5) and (6) shown below.

$$i_1(R_5 + R_6) = V_{D1} - V_A \quad (5)$$

From equations (4) and (5), $$V_{D1} \approx V_A + (V_Z + V_F)(R_5 + R_6)/R_5 \quad (6)$$

If the AFC voltage at the terminal 3 exceeds the reference voltage $V_A$ by $\Delta V_A$, the potential at the junction point of the resistors 4 and 5 changes by $$\Delta V_D' = R_4 \cdot \Delta V_A / (R_4 + R_5 + R_6) \quad (7)$$

On the other hand, the change in potential at the junction point between the resistors 5 and 6 is given as $$\Delta V_M' = (R_4 + R_5) \cdot \Delta V_A / (R_4 + R_5 + R_6) \quad (8)$$

As a result, even though the AFC voltage increases by $\Delta V_A$, the voltage regulating diode 7 remains cut off, thus preventing the AFC voltage from being superimposed on the tuning voltage through the voltage regulating diode 7. Next, if the tuning voltage increases up to a level $V_{D2}$ where the voltage tuning diode 7 begins to conduct, $$i_1 = (V_Z + V_F)/R_5 \quad \left.\begin{array}{r}\\ \\\end{array}\right\} \quad (9)$$
$$i_2 = \{V_{D2} - V_A - (V_Z + V_F)(R_5 + R_6)/R_5\}/R_6 \approx 0$$

Under this condition, if the AFC voltage increases by $\Delta V_A$, the voltage regulating diode 7 is cut off and, therefore, the AFC voltage $\Delta V_D$ superimposed on the tuning voltage through the voltage regulating diode 7 is very small as given below.

$$\Delta V_D = i_2 \cdot R_4 = R_4\{V_{D2} - V_A - (V_Z + V_F)(R_5 + R_6)/R_5\}/R_6 \approx 0 \quad (10)$$

With a further increase in the tuning voltage, the AFC voltage superimposed on the tuning voltage also increases, as easily seen from the equations (6), (9) and (10). The AFC voltage change $\Delta V_A$ is accompanied by the change $\Delta i_2$ of the current $i_2$ given as $$\Delta i_2 = -\Delta V_A / R_6 \quad (11)$$

When the tuning voltage increases even further to such a degree as to satisfy the following relation $$i_2 + \Delta i_2 \geq 0 \quad (12)$$

the voltage regulating diode 7 is kept conducting even if the AFC voltage at the terminal 3 increases by $\Delta V_A$, so that the AFC voltage superimposed on the tuning voltage through the voltage regulating diode 7 becomes maximum. Under this condition, the tuning voltage $V_{D3}$ is expressed as shown below from the equations (9), (10) and (11).

$$V_{D3} = V_A + (V_Z + V_F)(R_5 + R_6)/R_5 + \lambda$$
$$\Delta V_A \approx V_{D2} + \Delta V_A \quad (13)$$

As evident from equation (13), the AFC sensitivity is gently compensated substantially in the range of $\Delta V_A$, thus stabilizing the AFC operation. Although the above description refers to the case of an increased AFC voltage, the AFC sensitivity may be gently compensated on the same principle as well when the AFC voltage is decreased by $\Delta V_A$.

Figure 8:
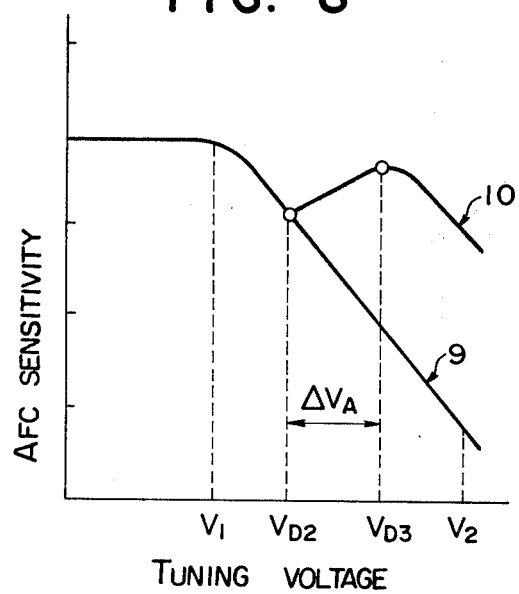
FIG. 8 is a diagram for illustrating compensation for an interchannel deviation of AFC sensitivity, which can be achieved by the AFC voltage superimposing circuit according to the invention.

The AFC sensitivity of the electronic tuner according to the present invention is shown in FIG. 8. In this drawing, the curve 9 represents the AFC sensitivity according to the prior art and the curve 10 that according to the present invention. As shown, the interchannel deviation of the AFC sensitivity is successfully reduced.

The AFC voltage superimposing circuit according to the present invention has another advantage that the interchannel deviation of AFC sensitivity may be compensated in a wider voltage range of tuning voltages as compared with the conventional circuit capable of compensating the interchannel deviation of the AFC sensitivity.

Such an advantage will be explained below with reference to FIGS. 1 and 2.

In FIG. 1, assume that the resistance values of the resistors 12, 13 and 14 are $R_{12}$, $R_{13}$ and $R_{14}$, respectively, and that the resistance values of the resistors 15 and 16 are sufficiently small as compared with that of the resistor 14 for convenience of explanation. Also, assume that the diode 17 is conducting with the voltage $V_D'$ which is set at a maximum tuning voltage $V_D'$ (max). When the AFC voltage changes by $\Delta V_A$, the AFC voltage $\Delta V_D'$ superimposed on the tuning voltage is expressed as $$\Delta V_D' = \frac{R_{12}}{R_{16} + R_{13} \cdot R_{14}/(R_{13} + R_{14})} \cdot \Delta V_A \quad (14)$$

Accordingly, the maximum tuning voltage is given as $$V_D'(\text{max}) = V_1 - \frac{R_{12}(V_1 - V_A)}{R_{12} + R_{13} \cdot R_{14}/(R_{13} + R_{14})} \quad (15)$$

From equation (3), the AFC voltage $\Delta V_D$ superimposed on the tuning voltage of the AFC voltage superimposing circuit according to the present invention shown in FIG. 3 is given as $$\Delta V_D = \frac{R_4}{R_4 + R_6} \cdot \Delta V_A \quad (16)$$

while the maximum tuning voltage $V_D$ (max) is $$V_D(\text{max}) = V_1 - \frac{R_4(V_1 - V_A - V_Z - V_F)}{R_4 + R_6} \quad (17)$$

Subject to the same AFC sensitivity, then from equations (14) and (17), $$\left. \begin{array}{l} R_{12} = R_4 \\ R_{13} \cdot R_{14}/(R_{13} + R_{14}) = R_6 \end{array} \right\} \quad (18)$$

From equations (15) and (18), the maximum tuning voltage of the conventional AFC voltage superimposing circuit is given as $$V_D'(\text{max}) = V_1 - \frac{R_4(V_1 - V_A)}{R_4 + R_6} \quad (19)$$

Therefore, from equations (17) and (19), $$V_D(\text{max}) - V_D'(\text{max}) = \frac{R_4 \cdot (V_Z + V_F)}{R_4 + R_6} \quad (20)$$

The equation (20) indicates that, when the AFC sensitivity is the same, the AFC voltage superimposing circuit according to the present invention provides a wider tuning voltage range than the conventional AFC voltage superimposing circuit shown in FIG. 1.

The foregoing description concerns the circuit in which, as shown in FIG. 3, the anode terminals of the voltage regulating diode 7 and the diode 8 are directly connected with each other, and the cathode terminals thereof are connected to the tuning voltage output terminal and the junction point of the resistors 5 and 6, respectively. Unlike this circuit, obviously they may alternatively be connected with an equal effect to the junction points of the three or more resistors connected in series between the tuning voltage output terminal 2 and the AFC voltage input terminal 3 as shown in FIG. 4. The resistors 5 and 18 practically function like the resistor 6 of FIG. 3, and the total resistance of the resistors 5 and 18 is determined to be the same as that of resistor 6 of FIG. 3. As another alternative, a resistor may obviously be inserted in the series-circuit including the voltage regulating diode 7 and the diode 8 with an equal effect as shown in FIG. 5.

Figure 6:
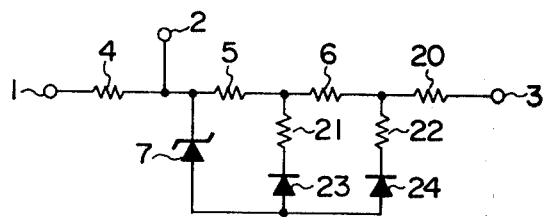
Figure 7:
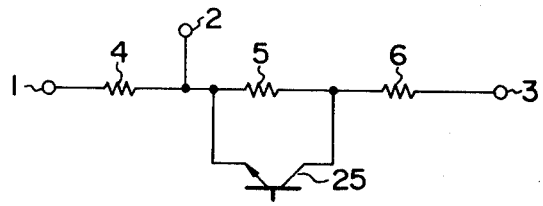

Other embodiments of the invention are shown in FIGS. 6 and 7. Referring to FIG. 6, reference numerals 1 to 7 denote like component elements in FIG. 3. Resistors 21 and 22 and the diodes 23 and 24 are used for reducing the interchannel deviation of the AFC sensitivity as well as for blocking a reverse current. In spite of the same operating principle as for the circuit of FIG. 3, the embodiment under consideration, with two series diode-resistor pairs connected in parallel, is capable of compensating the AFC sensitivity with a different tuning voltage, thus reducing the interchanel deviation of the AFC sensitivity.

Numerals 1 to 6 in FIG. 7 designate the same component elements as shown by like numerals in FIG. 3. The difference of the circuit of FIG. 7 lies in that a transistor 25 with its base kept open has replaced the voltage regulating diode 7 and the diode 8 in FIG. 3. By keeping open the base of the transistor 25, the breakdown characteristic of the PN-junction between its base and emitter is utilized as that of a voltage regulating diode, while the PN-junction between its base and emitter is used as a diode. This embodiment, though it operates on the same principle as the embodiment of FIG. 3, has a simpler configuration.

Figure 9:
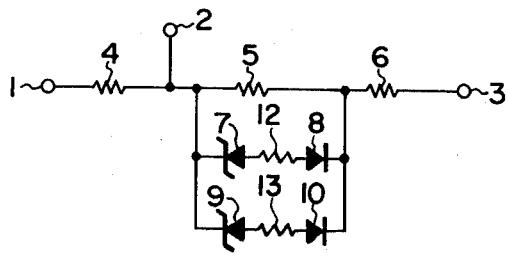
FIGS. 9 and 10 are circuit diagrams showing the other embodiments of the AFC voltage superimposing circuit according to the invention.
Figure 10:
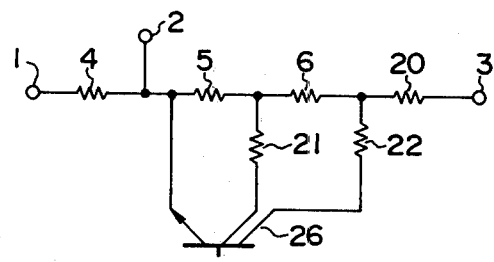

FIG. 9 shows the other embodiment of the invention using two voltage regulating diodes 7 and 9 which have a different zener voltage, connected at one end in series with respective diodes 8 and 10 through respective resistors 12 and 13 and connected in common to the tuning voltage output terminal 2 at the other end. The other ends of the diodes 8 and 10 are connected in common to the junction point between the resistors 5 and 6. In this case, the AFC voltage superimposing circuit causes the voltage regulating diodes 7 and 9 to come into a conducting state respectively at a different predetermined level of the tuning voltage corresponding to respective zener voltages, thereby to compensate more properly the interchannel deviation of the AFC sensitivity. FIG. 10 shows the other embodiment of the invention in which a multi-collector type transistor is used to compensate the interchannel deviation of the AFC sensitivity on the same principle as the embodiment shown in FIG. 6.

It will thus be understood that the present invention has the advantage that the electronic tuner according to the invention permits the AFC circuit to be removed from the local oscillator circuit with the result that the designing work for the electronic tuner may be facilitated on the one hand and its productivity improved on the other hand, and in addition, a very small interchannel deviation of the AFC sensitivity may be maintained during AFC operation since the AFC voltage to be superimposed is varied with the amplitude of the tuning voltages.

We claim:

1. An AFC voltage superimposing circuit for an electronic tuner using a plurality of varactors as a tuning element, comprising:
    (a) a first terminal connected to a circuit for generating a tuning voltage;
    (b) a second terminal connected to a tuning circuit using a plurality of varactors;
    (c) a third terminal connected to an AFC voltage generating circuit;
    (d) a first resistor connected between said first and second terminals;
    (e) a first series-circuit including a second, a third and a fourth resistor connected in series, said first series-circuit being connected between said second and third terminals; and
    (f) a bypass circuit including a voltage regulating diode, a first and a second diode, and a fifth and a sixth resistor, said voltage regulating diode and said first and second diodes being connected in common at one end, the other end of said voltage regulating diode being connected to said second terminal, other ends of said first and second diodes being connected to the junction points between said second and third resistors and between said third and fourth resistors through one of said fifth and sixth resistors respectively, said bypass circuit having the characteristic of permitting a current to flow in one direction only, said voltage regulating diode and said first and second diodes being disposed in such polarity that when said tuning voltage exceeds a predetermined level, said voltage regulating diode and said first and second diodes come into a conducting state, thereby permitting a current to flow from said first terminal to said third terminal and thus increasing an AFC voltage variation superimposed on said tuning voltage, whereby an interchannel deviation of AFC sensitivity may be reduced.

2. An AFC voltage superimposing circuit claimed in claim 1, wherein said bypass circuit comprises a multi-collector type transistor with its base kept open, said transistor being disposed in such polarity that the PN-junctions between its base and emitter and between its base and collectors may operate as said voltage regulating diode and said first and second diodes, respectively.

3. An AFC voltage superimposing circuit for an electronic tuner using a plurality of varactors as a tuning element, comprising:
    (a) a first terminal connected to a circuit for generating a tuning voltage;
    (b) a second terminal connected to a tuning circuit using a plurality of varactors;
    (c) a third terminal connected to an AFC voltage generating circuit;
    (d) a first resistor connected between said first and second terminals;
    (e) a first series-circuit including a second and a third resistor, said first series-circuit being connected between said second and third terminals;
    (f) a second series-circuit including a first voltage regulating diode, a first diode and a fourth resistor connected in series and having a characteristic of permitting a current to flow in one direction only, said second series-circuit being connected in parallel to one of said second and third resistors;
    (g) a third series-circuit including a second voltage regulating diode, a second diode and a fifth resistor connected in series and having the characteristic of permitting a current to flow in one direction only, said third series-circuit being connected in parallel to said second series-circuit, said first and second voltage regulating diodes having a first and a second zener voltage, said first and second voltage regulating diodes and said first and second diodes being disposed in such polarity that when said tuning voltage exceeds respective predetermined levels corresponding to said first and second zener voltages, said second and third series-circuits permit a current to flow from said first terminal to said third terminal, respectively, thereby increasing an AFC voltage variation superimposed on said tuning voltage, whereby an interchannel deviation of AFC sensitivity may be reduced.

* * * * *